United States Patent
Pokharna

(10) Patent No.: US 11,943,899 B1
(45) Date of Patent: Mar. 26, 2024

(54) COMPOSITE THERMAL INTERFACE MATERIALS AND ASSOCIATED DEVICES, SYSTEMS, AND METHODS

(71) Applicant: Deeia Inc., Saratoga, CA (US)

(72) Inventor: Himanshu Pokharna, Saratoga, CA (US)

(73) Assignee: Deeia Inc., Saratoga, CA (US)

( * ) Notice: Subject to any disclaimer, the term of this patent is extended or adjusted under 35 U.S.C. 154(b) by 0 days.

(21) Appl. No.: 18/199,881

(22) Filed: May 19, 2023

(51) Int. Cl.
*H05K 7/20* (2006.01)
*H01L 23/373* (2006.01)
*H01L 23/427* (2006.01)

(52) U.S. Cl.
CPC ........ *H05K 7/20454* (2013.01); *H01L 23/373* (2013.01); *H01L 23/4275* (2013.01); *H05K 7/20481* (2013.01)

(58) Field of Classification Search
CPC ............ H05K 7/20454; H05K 7/20481; H01L 23/373; H01L 23/4275
See application file for complete search history.

(56) References Cited

U.S. PATENT DOCUMENTS

| | | | |
|---|---|---|---|
| 2005/0049357 A1* | 3/2005 | Zhong | H01L 23/3737 524/588 |
| 2005/0228097 A1* | 10/2005 | Zhong | B82Y 30/00 524/439 |
| 2008/0237841 A1* | 10/2008 | Arana | H01L 23/433 257/E23.11 |
| 2019/0132994 A1* | 5/2019 | Johnson | H01R 13/6581 |
| 2020/0373220 A1* | 11/2020 | Chan Arguedas | H01L 23/5385 |

* cited by examiner

*Primary Examiner* — Zachary Pape
(74) *Attorney, Agent, or Firm* — WORKMAN NYDEGGER

(57) ABSTRACT

A heat-transfer component defines a thermal-interface surface and has a composite thermal-interface material on the thermal-interface surface. The composite thermal-interface material comprises a silicone oil substrate and a metallic filler. In some embodiments, the metallic filler undergoes a transition from solid to liquid at a temperature below a typical operating temperature of an electronic device. For example, an embodiment of a metallic filler has a solid-to-liquid transition temperature between about 25° C. and about 95° C. In some embodiments, a second thermal interface material extends around an outer periphery of the composite thermal interface material, which can inhibit or prevent seepage or other migration of metallic filler in the composite thermal-interface material out of a thermal interface region between the heat-transfer component and, e.g., a heat-generating component. Also disclosed are electrical devices having a heat generating component cooled by such a heat-transfer component.

32 Claims, 6 Drawing Sheets

COMPOSITE THERMAL INTERFACE MATERIALS AND ASSOCIATED DEVICES, SYSTEMS, AND METHODS

FIELD

This application and the subject matter disclosed herein (collectively referred to as the "disclosure"), generally concern composite thermal interface materials containing one or more metals that are liquid or partially or wholly undergo phase transition within an expected range of operating temperatures. More particularly, but not exclusively, this disclosure pertains to devices and systems for transferring heat, e.g., for cooling heat-generating, electrical components, that incorporate such thermal-interface materials.

BACKGROUND INFORMATION

Many industrial processes, consumer goods, power generators, combustion chambers, communication devices, information storage devices, electronic components, electrical storage components (e.g., batteries), etc., and associated systems, rely on heat transfer to function as intended. For example, some rely on cooling (e.g., radio transmitters) and others rely on heating (e.g., endo-thermic chemical reactions) to maintain a temperature within a specified range between an upper threshold temperature and a lower threshold temperature.

The prior art has responded to these challenges with a number of techniques for transferring heat from one medium to another. For example, conventional air cooling uses a fan or other air-mover to draw heat away from or to convey heat to another medium. Air cooling can be supplemented with an air-cooled heat sink, e.g., often a plate of thermally conductive material having surfaces, or fins, extending from the plate to provide a larger surface area available for transferring heat to or from the air flowing over the extended surfaces. Some heat-transfer systems use a liquid to transfer heat, as many liquids provide a relatively higher rate of heat transfer compared to gasses, e.g., air. In still other systems, a heat-transfer fluid changes phase from liquid to gas (or vice-versa) to absorb (or to dissipate, respectively) relatively large amounts of energy over a narrow range of temperatures.

Some prior approaches for transferring heat use a heat-transfer component (e.g., a "heat exchanger," "heat sink," "cold plate," "evaporator," or "condenser") to transfer heat to a fluid (e.g., a liquid, a gas, or a mixture thereof) from a solid device, or vice-versa. For example, a typical heat-transfer component defines an intended heat-transfer surface to be placed in thermal contact with a corresponding surface of the other device. Such placement provides a conductive heat-transfer path between the heat-transfer component and the other device. The heat-transfer component, in turn, can facilitate convective heat transfer between the fluid passing through or over solid features of the heat-transfer component and those solid features. Accordingly, when the heat-transfer component is placed in thermal contact with the other device, a combination of convective and conductive heat-transfer mechanisms facilitate heat transfer between the other device and the fluid passing through or over the heat-transfer component.

For example, a cold plate or a heat sink for cooling a heat-generating component (e.g., a processing unit of a computer system) is typically placed into thermal contact with a corresponding surface of the heat-generating component or its packaging. As the heat-generating component operates, excess heat conducts across the interface between the heat-generating component and the cold plate or heat sink. A cooling medium (e.g., air, a mixture of water and glycol, or a two-phase refrigerant) passes through or over features of the cold plate or heat sink, absorbing the excess heat through convective heat-transfer and carrying it away from the cold plate or heat sink to be rejected elsewhere.

A solid-solid interface, even between machined, flat surfaces, can introduce a substantial thermal resistance to the heat-transfer system. As used herein, the term "thermal resistance" means the ratio of temperature difference between two regions to the heat-flux between the two regions. As used herein, "heat-flux" means the rate of heat-transfer per unit area. Thus, "thermal resistance" is the ratio of temperature difference to rate of heat transfer per unit area between two regions, which yields units of ° $C\text{-}cm^2/W$. Accordingly, an interface with higher thermal resistance results in a relatively larger temperature gradient across the interface for a given heat flux as compared to an interface with lower thermal resistance exposed to the same heat flux. Conversely, a relatively higher thermal resistance results in a relatively lower rate-of-heat-transfer limit through a given region for a given allowable change in temperature compared to the rate-of-heat-transfer limit for the same allowable change in temperature across an interface having a lower thermal resistance. Some practitioners also refer to this "thermal resistance" as "thermal impedance."

Greases and pastes have been used to reduce the so-called thermal-contact resistance (sometimes also referred to in the art as a "contact resistance," "thermal-interface resistance," or "interface resistance") at solid-solid interfaces, improving the capacity to transfer heat across a given interface for a given temperature gradient across the interface. Such greases and pastes include powdered fillers, e.g., aluminum oxide (AlO), zinc oxide (ZnO), Aluminum (Al), silicon oxide (SiO), and combinations thereof, dispersed throughout a carrier of silicone oil. Nevertheless, thermal-contact resistance has remained and still remains a substantial component of the overall thermal budget in many applications facing high power and limited upper-threshold temperature targets.

SUMMARY

Disclosed thermal-interface materials can provide a low thermal-contact resistance across a variety of solid-solid interfaces. For example, some disclosed materials can provide a thermal resistance of less than about 0.03° $C\text{-}cm^2/W$, such as, for example, about 0.01° $C\text{-}cm^2/W$, e.g., between about 0.01° $C\text{-}cm^2/W$ and about 0.05° $C\text{-}cm^2/W$, with between about 0.015° $C\text{-}cm^2/W$ and about 0.04° $C\text{-}cm^2/W$ being a particular exemplary range of thermal resistance for certain embodiments. Moreover, disclosed materials can deliver such performance using conventional compressive loads across the thermal interface. By comparison, conventional "high-performance" thermal-interface materials, e.g., based on silicone oil filled with a combination of Al, AlO, ZnO, and SiO (spanning a typical thermal interface under conventional compressive loads) provide a thermal resistance of about 0.06 $C\text{-}cm^2/W$, such as, for example, between about 0.04° $C\text{-}cm^2/W$ and about 0.2° $C\text{-}cm^2/W$. Accordingly, disclosed materials offer reductions in thermal-interface resistance of about 50%, or more, compared to conventional "high-performance" thermal-interface materials.

In some embodiments, a heat-transfer component defines an outer surface configured to mate with a corresponding surface of another device (which can be exothermic or endothermic during its operation). For example, the outer surface of the heat-transfer component can be substantially planar ("flat"), i.e., the outer surface can have a measure of flatness less than about 70 µm/cm, such as, for example, between about 10 µm/cm and about 75 µm/cm, with between about 20 µm/cm and about 50 µm/cm being but one exemplary range of flatness. The corresponding surface of the other device can similarly be flat. In other embodiments, an outer surface of the heat-transfer component can be machined or otherwise formed to have a complementary contour relative to an opposed surface of the other device (e.g., a heat-generating component). For example, if a heat-generating component has a convex (or other, e.g., arbitrary, non-flat surface), the outer surface of the heat-transfer component can have a complementary concave (or other negative, non-flat contour) that mates closely with the surface of the heat-generating component.

When mated together, the flat surface of the heat-transfer component can be positioned opposite the corresponding surface of the other device, and a disclosed interface material can be positioned between the opposed surfaces. As described more fully below, this arrangement can provide a thermal-contact resistance between the mated surfaces of less than about 0.03 C-cm$^2$/W, such as, for example, about 0.01° C-cm$^2$/W, e.g., between about 0.01° C-cm$^2$/W and about 0.05° C-cm$^2$/W, with between about 0.015° C-cm$^2$/W and about 0.04° C-cm$^2$/W being a particular exemplary range of thermal resistance for certain embodiments.

Nevertheless, as explained more fully below, disclosed thermal-interface materials can be more forgiving during manufacturing and assembly than prior, conventional thermal-interface materials. For example, disclosed thermal-interface materials can provide lower thermal-resistance across a non-uniform solid-solid interface (e.g., arising from one solid surface being tilted relative to the opposed solid surface, or from a non-uniform surface flatness) than a conventional paste, grease or foil provides, even with a relatively more uniform solid-solid interface.

Another aspect of this disclosure pertains to heat-transfer components that incorporate a disclosed composite thermal-interface material. For example, a thermal-interface surface of a heat-transfer component can have a first region and a second region. The first region can have an outer periphery and the second region can surround the outer periphery of the first region. A volume of composite thermal-interface material can be contained within the outer periphery of the first region. The composite thermal-interface material can include a silicone oil substrate and a metallic filler. The metallic filler can have a solid-to-liquid transition temperature between about 10° C. and about 95° C. The heat-transfer component can also have a volume of second thermal-interface material within the second region. A composition of the composite thermal-interface material can differ from a composition of the second thermal-interface material.

In an embodiment, the volume of composite thermal-interface material is a first volume of composite thermal-interface material and the heat-transfer component can include a second volume of composite thermal-interface material. The thermal-interface surface can also define a further region bounded by the volume of second thermal-interface material and filled with the second volume of composite thermal-interface material.

In an embodiment, the metallic filler material comprises gallium, or an alloy thereof. The second thermal-interface material can be non-reactive with gallium, or the alloy thereof. For example, the second thermal-interface material can include a silicone oil carrier substrate filled with a powdered metal, a powdered ceramic, or both, or the second thermal-interface material comprises a curable thermal-interface material.

The second thermal-interface material can be positioned outward of the composite thermal-interface material, defining a gap between the composite thermal-interface material and the second thermal-interface material.

The composite thermal-interface material can be screen printed to define a pixelated array on the thermal-interface surface. In such an embodiment, the second thermal-interface material can be positioned outward of the composite thermal-interface material, defining a gap between the composite thermal-interface material and the second thermal-interface material.

A volume resistivity of the composite thermal-interface material can exceed about 50 Ohm-cm in some embodiments.

A ratio of volume resistivity of the second thermal-interface material to a volume resistivity of the composite thermal-interface material can exceed about $10^4$.

Yet another aspect of this disclosure pertains to electrical devices. For example, an electrical device can include a heat-generating component defining a first thermal-interface surface. A heat-transfer component can define a second thermal-interface surface. The first thermal-interface surface and the second thermal-interface surface can be positioned opposite to each other, defining a thermal interface between the heat-generating component and the heat-transfer component. The thermal interface between the heat-generating component and the heat-transfer component can include a first region having an outer periphery and a second region surrounding the outer periphery of the first region. A composite thermal-interface material can be within the thermal interface between the heat-generating component and the heat-transfer component. The composite thermal-interface material can include a silicone oil substrate and a metallic filler. The metallic filler can have a solid-to-liquid transition temperature between about 10° C. and about 95° C. The composite thermal-interface material can be positioned within the outer periphery of the first region. A second thermal-interface material can be within the second region. A composition of the composite thermal-interface material can differ from a composition of the second thermal-interface material.

The metallic filler material can include gallium, or an alloy thereof. The second thermal-interface material can be non-reactive with gallium.

The thermal interface between the heat-generating component and the heat-transfer component can include a third region having an outer periphery. The second region can also enclose the third region. The composite thermal-interface material positioned within the outer periphery of the first region can be a first volume of composite thermal-interface material. The electrical device can also include a second volume of composite thermal-interface material within the third region of the thermal interface.

A volume resistivity of the composite thermal-interface material can exceed about 50 Ohm-cm.

A ratio of volume resistivity of the second thermal-interface material to a volume resistivity of the composite thermal-interface material can exceed about $10^4$.

The heat-transfer component can be a heat-removal device configured to dissipate heat received from a heat-generating electronic component. The heat-removal device can have a base, and the base can have a first major surface and a second major surface opposite the first major surface.

The first major surface of the base can define the second thermal-interface surface. The heat-removal device can also include a plurality of fins extending from the second major surface of the base.

Embodiments of heat-generating components can include an electronic processing unit, a power electronics device, or a combination thereof.

The heat-generating component can be a first heat-generating component, and the electrical device can include a second heat-generating component. The first heat-transfer component can also be thermally coupled with the second heat-generating component.

The foregoing and other features and advantages will become more apparent from the following detailed description, which proceeds with reference to the accompanying drawings.

BRIEF DESCRIPTION OF THE DRAWINGS

Referring to the drawings, wherein like numerals refer to like parts throughout the several views and this specification, aspects of presently disclosed principles are illustrated by way of example, and not by way of limitation.

DETAILED DESCRIPTION

The following describes various principles related to composite thermal-interface materials. More particularly, but not exclusively, some embodiments include devices and systems for transferring heat (e.g., for cooling heat-generating, electrical components) that incorporate such a composite thermal-interface material. Some disclosed thermal-interface materials include a dispersion of metallic filler within a silicone oil or other substrate, e.g., suitable organic materials. In some embodiments, the metallic filler is molten, or begins to melt, at or near typical ambient temperatures, which is surmised to improve a conductive heat-transfer path across a thermal interface between two components. As should be understood following a review of this disclosure, components and systems having attributes that are different from those specific examples discussed herein can embody one or more presently disclosed principles, and can be used in applications not described herein in detail. Accordingly, such alternative embodiments also fall within the scope of this disclosure.

Concepts disclosed herein generally concern composite thermal-interface materials, and in some respects, their application to heat-transfer components and use in heat-transfer systems. For example, some disclosed concepts pertain to systems, methods, and components to facilitate cooling of heat-generating components, in part by applying a composite thermal-interface material to a surface of a heat-transfer component. In other respects, material composition and physical properties of disclosed composite thermal-interface materials are described. And in still other respects, methods of manufacturing and assembling components that incorporate disclosed composite thermal interface materials are described.

Figure 1:
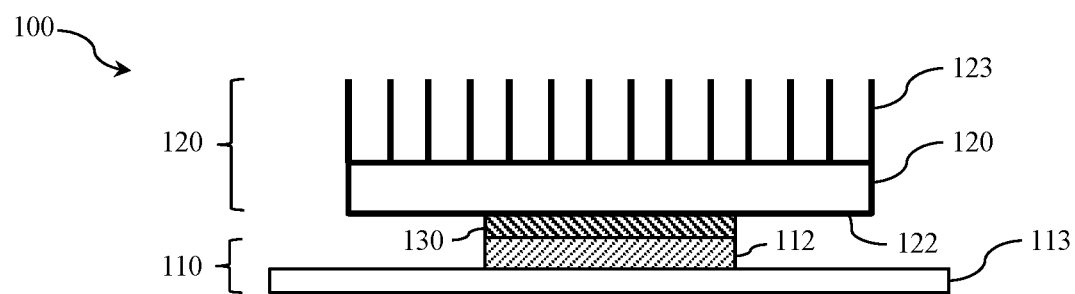
FIG. 1 schematically illustrates a cross-sectional view of a heat-transfer component thermally coupled with a heat-generating component embodied as a processing unit (e.g., a graphics processing unit, a central processing unit).

Referring now to FIG. 1, a cross-sectional view of a heat transfer assembly 100 is described. The assembly 100 includes a heat-generating component 110 cooled by a heat-transfer component 120. A thermal-interface material 130, e.g., a composite thermal-interface material as described herein, is disposed in the interstitial region between a major surface 122 of the heat-transfer component and an opposed major surface (un-numbered) of the heat-generating component 110 (e.g., a processing unit 112 mounted to a circuit board or other substrate 113) to facilitate conductive heat-transfer from the heat-generating component 110 to the heat-transfer component 120. The interstitial region between the heat-transfer component and the heat-generating component is enlarged in FIG. 1 for illustrative purposes.

As noted above, a heat-transfer component 120 can assume any of a variety for configurations. Although not so limited, FIG. 1 schematically illustrates the heat-transfer component 120 as a heat sink. The illustrated heat-transfer component 120 includes a conductive base 121 having fins 123 extending upwardly from an upper surface thereof. The fins 123 define flow channels 124 (e.g., minichannels or microchannels) therebetween. Although the heat-transfer component 120 is depicted as a heat sink, a heat-transfer component as described herein can have any of a variety of configurations, e.g., an air-cooled heat sink, a liquid-cooled cold plate, an evaporatively cooled cold plate, or any of these alone or in combination with an embedded heat pipe base or a vapor chamber base. Nevertheless, the heat-transfer component has a major surface 122 that defines an intended thermal-contact region (e.g., the region of the surface 122 covered by the thermal-interface material 130).

Like the heat-transfer component 120, the heat-generating component 110 can assume any of a variety of configurations. Although not so limited, FIG. 1 depicts the heat-generating component 110 as a processing unit having a single functional die 112 mounted in a so-called "flip-chip" arrangement to a functional substrate 113. Solder bumps (not shown) can provide physical and electrical connectivity between circuitry defined by the package 112 and electrical circuitry defined by the substrate 113. (The substrate's 113 further circuitry and solder connections are also omitted from FIG. 1 for clarity.) Although a bare die is schematically illustrated, with some embodiments, the die 112 can be covered by, e.g., an integrated heat spreader or other packaging. In such embodiments, the integrated heat spreader or other packaging is positioned between the die 112 and the heat-transfer component 120, and the heat transfer component 120 is placed into thermal contact with a top surface of the integrated heat spreader or other packaging, e.g., rather than the die 112.

Referring still to FIG. 1, the composite thermal-interface material 130 disposed in the interstitial region between the surface 122 and the opposed upper surface of the heat-generating component 110 defines an heat-generating contact region in direct physical contact with the outer surface of the heat-generating component 110. Similarly, the thermal-interface material 130 defines a heat-transfer-component-contact region in direct physical contact with the lower surface 122 of the base 121. Consequently, as depicted schematically in FIG. 2, the thermal-contact resistance at a solid-solid interface between the lower surface 122 of the base 121 and the opposed surface of the heat-generating component, improved with a thermal-interface material 130, can be described as a sum of three discrete, constituent thermal resistances: (1) a thermal-contact resistance between the lower surface 122 of the heat-transfer component and the upper surface of the thermal-interface material ($R_{c2}$ in FIG. 2); (2) a thermal resistance across the thermal-interface material from the upper surface of the TIM to the lower surface of the TIM, corresponding to the bulk thermal conductivity of the thermal interface material 130 ($R_{bulk}$ in FIGS. 2); and (3) a thermal-contact resistance ($R_{c1}$ in FIG. 2) between the lower surface the thermal-interface material and the upper surface of the heat-generating component, referred to as "Heat source" in FIG. 2.

Figure 2:
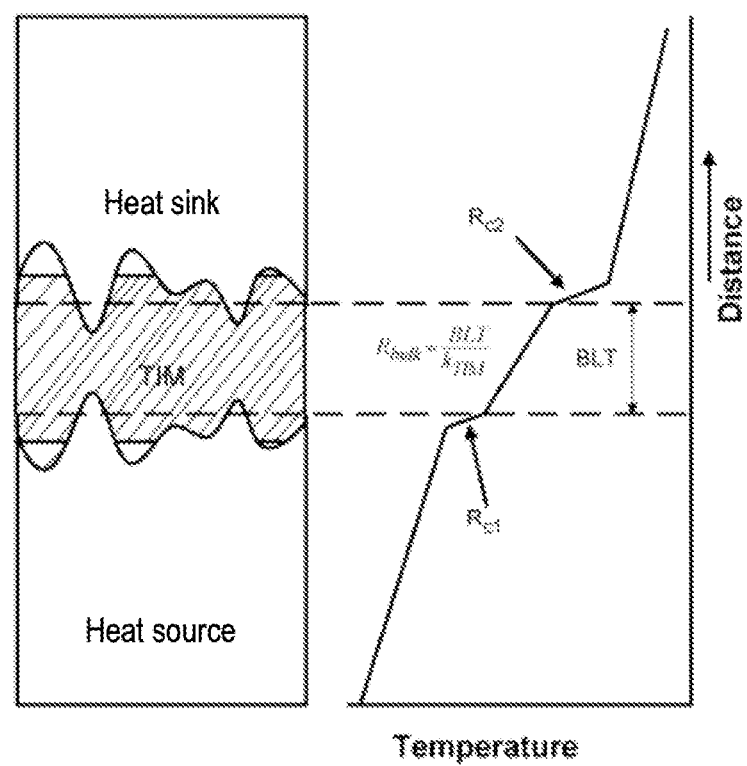
FIG. 2 schematically illustrates components of thermal-contact resistance at a thermal interface between two solids, e.g., a heat sink and a heat source.
Figure 3:
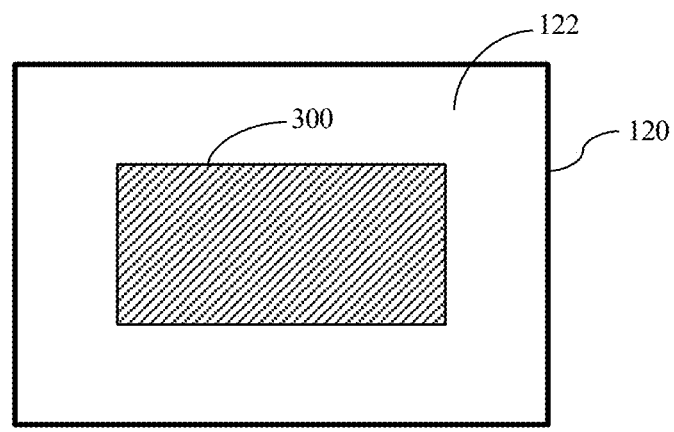
FIG. 3 schematically illustrates a prior-art thermal-interface material applied to an intended heat-transfer region defined by a major surface of a heat-transfer component, e.g., a heat sink or a cold plate.

As shown in FIG. 3, a prior thermal-interface material 300 (e.g., prior greases, pastes and even metallic foils) has conventionally been applied to a region of a heat-transfer component, e.g., to the surface 122 of the heat-transfer component 120 in FIG. 1, before placing the heat-transfer component into thermal contact with the heat-generating component (e.g., a bare die, an integrated heat spreader, or other packaging). Such prior approaches reduced the bulk thermal resistance ($R_{bulk}$ in FIG. 2) across the interface compared to an unfilled air gap, but also introduced additional thermal-contact resistances ($R_{c1}$ and $R_{c2}$ in FIG. 2), limiting the improvement to the overall thermal-contact resistance.

By contrast to prior approaches, composite thermal-interface materials include a metallic filler dispersed within a carrier substrate. In some embodiments, the metallic filler is liquid, begins to melt or is otherwise partially or wholly in a liquid phase at or within a selected temperature range (e.g., at room temperature or another temperature expected during operation). For example, some disclosed thermal-interface materials incorporate a metallic filler that is in its liquid phase (at normal ambient atmospheric pressures) at about 10° C., e.g., between about 5° C. and about 25° C. Other fillers are in a liquid phase under normal ambient atmospheric pressures at higher, albeit expected operating, temperatures, e.g., between about 25° C. and about 95° C., such as, for example, between about 35° C. and about 80° C., with between about 40° C. and about 70° C., between about 50° C. and about 60° C., or about 55° C. being specific examples of temperatures at which phase transition from solid-to-liquid begins or completes for eutectic and non-eutectic fillers disclosed herein.

Such composite thermal-interface materials can improve the constituent components of overall thermal-contact resistance shown in FIG. 2. For example, a liquid-phase filler can wet the surface of the heat-transfer component, as well as the surface of the heat-generating component, reducing the thermal-contact resistance between those components and the thermal interface material, e.g., $R_{c1}$ and $R_{c2}$ in FIG. 2. As well, the metallic filler can increase overall bulk thermal conductivity of the thermal-interface material thus reducing the bulk thermal resistance of the material compared to prior materials, e.g., $R_{bulk}$ in FIG. 2. For example, because the metallic filler can have a bulk thermal conductivity in excess of 20 W/m-K, e.g., between about 15 W/m-K and about 75 W/m-K, such as, for example, between about 20 W/m-K and about 30 W/m-K, or about 25 W/m-K in a specific embodiment, the overall thermal resistance of a disclosed thermal interface using a metallic filler can be substantially lower than a similar thermal interface using a conventional paste or grease.

In some instances, discrete particles (or "packets") of the liquid-phase filler dispersed throughout the carrier substrate can migrate small distances within the carrier substrate when in an in situ environment, especially when compressive forces are applied to urge the heat-transfer component 120 toward the heat-generating component 110, as in FIG. 1 (or "heat sink" toward the "heat source" in FIG. 2). Such migration can lead to agglomeration among smaller "particles," increasing the size of individuals "packets" of metallic filler within the composite TIM. The larger "packets" of metallic filler, in turn, can span across the interface gap between the heat-generating component and the heat-transfer component, providing a low-resistance conduction path through the thermal-interface material from the heat-generating component to the heat-transfer component and further improving thermal contact between the heat-generating component and the heat-transfer component.

Metallic filler materials can be electrically conductive. Accordingly, composite thermal-interface materials as described can provide an inadvertent and unwanted electrical conduction path, as when excess material escapes from the interstitial region between a heat-generating component and a heat-transfer component. Moreover, agglomeration of filler material within the composite thermal-interface material, as can occur under compressive loads, can lead to regions or zones with relatively high electrical conductivity relative to a bulk electrical conductivity of the composite thermal-interface material.

Figure 4:
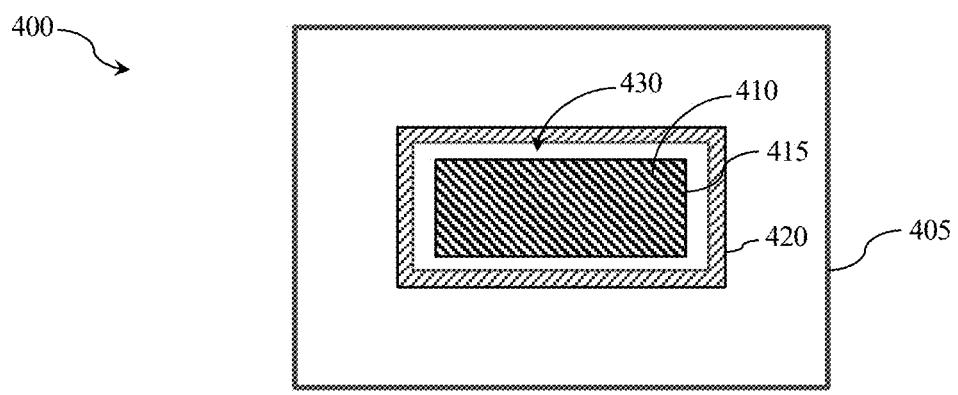
FIG. 4 schematically illustrates a disclosed thermal-interface material, which can be applied in a disclosed manner, to an intended heat-transfer region of a heat-transfer component to facilitate heat transfer across a thermal interface as in FIGS. 1 and 2.

Referring now to FIG. 4, a heat-transfer component 400 with a composite thermal-interface material 410 applied to a major surface of its base 405, prior to being placed in thermal contact with a heat-generating component, is described. As shown in FIG. 4, a second thermal-interface material 420 can circumscribe the composite thermal-interface material 410. In some embodiments, the second thermal-interface material 420 has less of the metallic filler than the composite TIM 410. In particular embodiments, the second TIM 420 is devoid of the metallic filler (at least when applied to the heat-transfer component 400).

As shown in FIG. 4, the second thermal-interface material 420 can be applied to the base 405 in a manner so that the second TIM 420 extends around an outer periphery 415 of the composite thermal-interface material. For example, the second thermal-interface material 420 can extend around the outer periphery 415, in spaced relation thereto, defining a peripheral gap 430 between the composite TIM 410 and the second TIM 420. On assembly of the heat-transfer component 400 (having a composite TIM and second TIM so-applied) with a heat-generating component (e.g., heat-generating component 110 described in relation to FIG. 1), the composite TIM 410 and the second TIM 420 can spread laterally outward, shrinking or even filling the peripheral gap 430. By enclosing the periphery 415 of the composite TIM 410 when the heat-transfer component 400 is assembled with a heat-generating component, the second TIM 420 can encapsulate the metallic filler within the composite TIM 410, inhibiting or altogether preventing the metallic filler from leaking, seeping or otherwise migrating out of the interface region defined between the heat-transfer component 400 and a heat-generating component.

As noted above, a composite thermal-interface material can include a metallic filler dispersed throughout a carrier substrate. In some embodiments a composite thermal-interface material 410 includes a silicone-oil based carrier substrate, or other suitable organic substrates, and a gallium alloy (or substantially pure gallium). An example of a suitable gallium alloy includes, pure gallium, as well as a gallium, indium and tin alloy. Some such alloys are available commercially under the mark Galinstan®. Such alloys can melt at temperatures as low as −19° C. and thus are liquid at typical room temperature.

Like disclosed composite TIMs, some embodiments of the second thermal-interface material 420 include a silicone-oil based carrier substrate. Nevertheless, to ensure material compatibility between a composite TIM 410 containing an alloy of gallium (or pure gallium) and the second TIM 420, some embodiments of the second thermal-interface material are devoid of fillers that contain aluminum or other materials incompatible or reactive with gallium. Nevertheless, the second TIM 420 can include one or more other filler materials to enhance thermal contact in the interface region filled with the second TIM. These other fillers can remain in a solid phase during operation of the heat-generating component, e.g., a powdered or other small-particle form of a filler. Examples of such other fillers include particle forms of ceramics, e.g., silicon carbide, diamond, zinc oxide, boron nitride, aluminum oxide etc. It is preferable, but not necessary to have similar order of magnitude of viscosity and/or similar bond line thickness for the two TIM materials 410 and 420. Other examples of suitable solid filler materials include particle forms of other metal alloys, e.g., alloys of copper or silver, that are non-reactive with the metallic filler in the composite TIM 410. In still other embodiments, the second thermal-interface material can be a curable thermal-interface material (e.g., an elastomer or a thin bondline epoxy) that cures or polymerizes when exposed to air or elevated (relative to typical ambient) temperatures. A second TIM 420, as described, can have a significantly higher thermal-interface resistance compared to disclosed thermal-interface materials 410 and even compared to conventional thermal-interface materials. Nevertheless, interface regions occupied by the second TIM typically are exposed to a significantly lower heat flux compared to interface regions occupied by disclosed composite thermal-interface material, and thus do not materially degrade overall thermal performance. Consequently, a deleterious effect on overall thermal performance from using the lower-performing second TIM 420 can be avoided by applying the composite TIM 410 in regions of high heat flux and applying the second TIM 420 to regions exposed to lower heat flux.

Despite containing metallic fillers, disclosed composite thermal-interface materials can have relatively high (compared to metals) volume resistivity. For example, some disclosed composite thermal-interface materials have a volume resistivity that exceeds about 50 Ohm-cm. Nevertheless, some embodiments of the second thermal-interface material have a volume resistivity that is on-the-order of $10^{12}$. Accordingly, a ratio of volume resistivity of disclosed second thermal-interface materials to volume resistivity of disclosed composite thermal-interface material can exceed about $10^4$, and can approach or exceed $10^6$, $10^7$, $10^8$, $10^9$, or even $10^{10}$.

Other embodiments of the metallic filler include eutectic and non-eutectic alloys of gallium having a solid-to-liquid transition temperature between about 5° C. and about 95° C., e.g., between about 15° C. and about 95° C., such as, for example, between about 25° C. and about 80° C., with between about 40° C. and about 70° C., between about 50° C. and about 60° C., or about 55° C. being specific examples of temperatures at which phase transition from solid-to-liquid occurs, or at least begins.

Disclosed metallic fillers can incorporate eutectic and non-eutectic mixtures of Bismuth, Indium, Tin and Gallium. As understood by those of ordinary skill in the art, eutectic mixtures exhibit a melting-point temperature (or a narrow-band of temperatures over which melting occurs) that is below the melting point of each constituent component in the mixture, while non-eutectic mixtures melt over a broader range of temperatures. Adjusting the relative weight percent of each constituent component in a mixture of, e.g., Bismuth, Indium, Tin and Gallium can correspondingly adjust the melting temperature (or range of temperatures for non-eutectic mixtures) of the mixture.

A viscosity of some disclosed metallic fillers in a molten phase is very low, which can exacerbate leakage, seepage or other migration that can occur when a thermal-interface is under compressive load. Nevertheless, the second TIM 420 (FIG. 4) that circumscribes the composite TIM 410 can be devoid of the metallic filler used in the TIM 410. Such a second TIM 420, by virtue of being devoid of the metallic filler in the composite TIM 410, can inhibit or prevent migration, seepage, or leakage of the molten-phase metallic filler outside a desired region of the interface between the heat-transfer component and the heat-generating component.

Figure 5A:
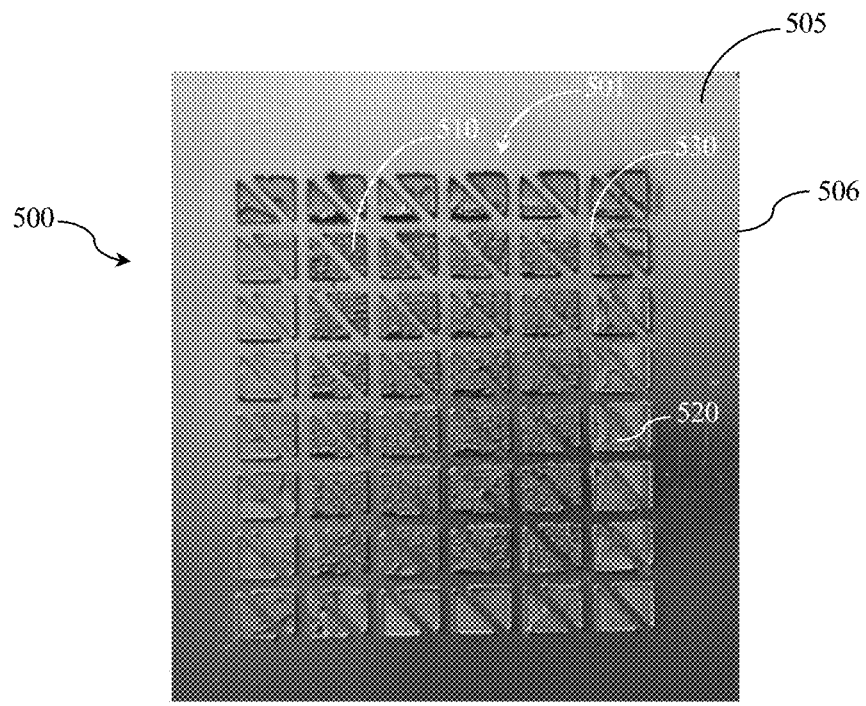
FIG. 5A shows a working embodiment of a thermal-interface material applied to an intended heat-transfer region defined by a major surface of a heat-sink base.
Figure 5B:
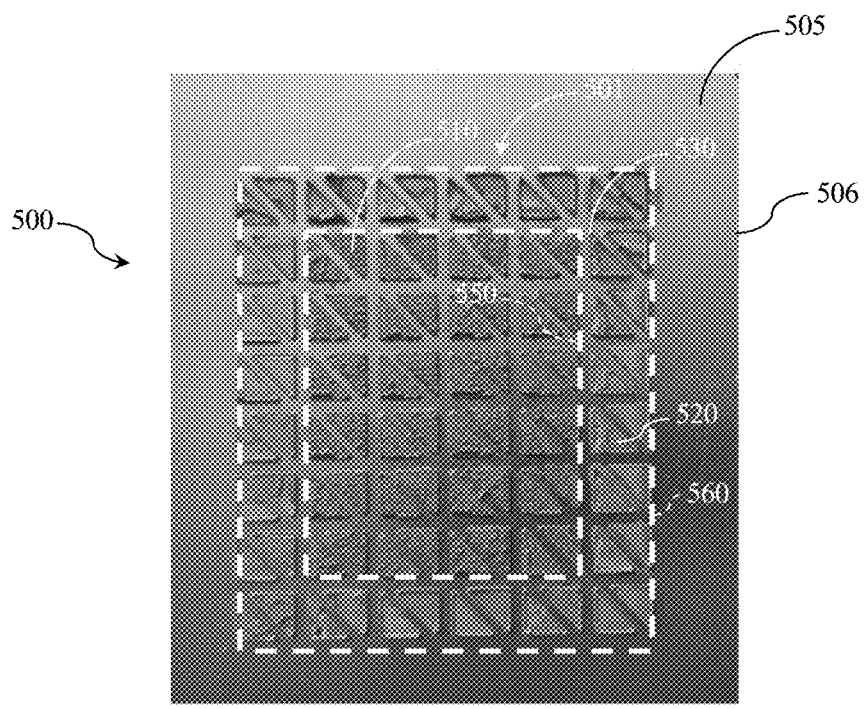
FIG. 5B shows the working embodiment in FIG. 5A with annotations denoting an inner region of thermal-interface material with a metallic filler and an outer region of thermal interface material devoid of the metallic filler.

FIGS. 5A and 5B show a photograph of a working embodiment 501 of a composite TIM 510 circumscribed by a second TIM 520 applied to a major surface 505 of a base 506 of a heat-transfer component. The annotations in FIG. 5B depict an inner region 550 of the major surface 505 and an outer region 560 of the major surface 505. The composite TIM 510 has been applied to the major surface 505 within the inner region 550 and the second TIM 520 has been applied to the major surface 505 within the outer region 560. As with the composite and second TIMs shown schematically in FIG. 4, the second TIM 520 extends around an outer periphery of the composite TIM 510 in spaced relation to the composite TIM, defining a gap 530 therebetween.

Figure 5C:
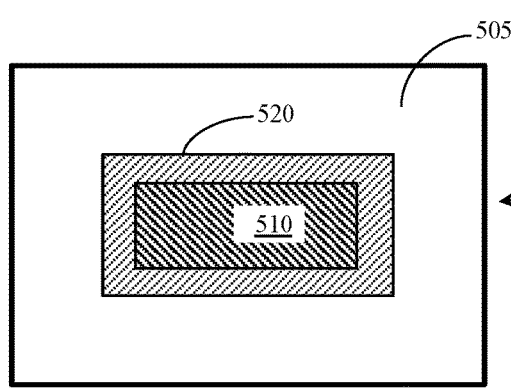
FIG. 5C shows an embodiment suitable for a heat-generating component having an expected "hot spot."
Figure 5E:
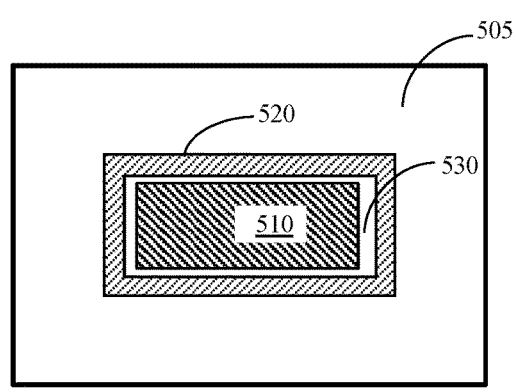
FIG. 5E shows an embodiment suitable for a heat-generating component having an expected "hot spot."
Figure 5D:
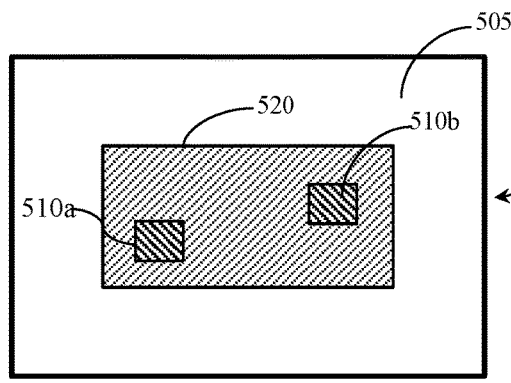
FIG. 5D shows an embodiment suitable for a heat-generating component having an expected "hot spot."
Figure 5F:
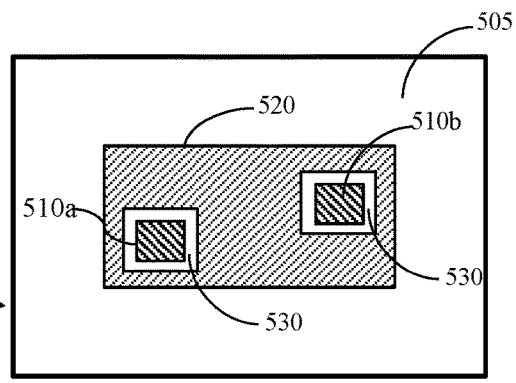
FIG. 5F shows an embodiment suitable for a heat-generating component having an expected "hot spot."

FIG. 5A and 5B show a majority of the thermal-interface material being applied to the heat-transfer component being a composite material 510, with just a single layer of second thermal-interface material 520 extending around the composite material. Other embodiments (e.g., FIGS. 5C and 5E) rely on a relatively small quantity of composite material 510 applied to an interface region exposed to an expected "hot spot" (e.g., a region of high heat flux) with the remainder of the interface between the heat-transfer component and the heat generating component being filled with a relatively lower performance, but electrically insulating, second TIM 520. In still other embodiments FIGS. 5D and 5F), the composite material 510 can be applied to a plurality of interface regions (expected to be exposed to hot spots) interspersed among other regions filled with the second TIM 520.

Figure 6:
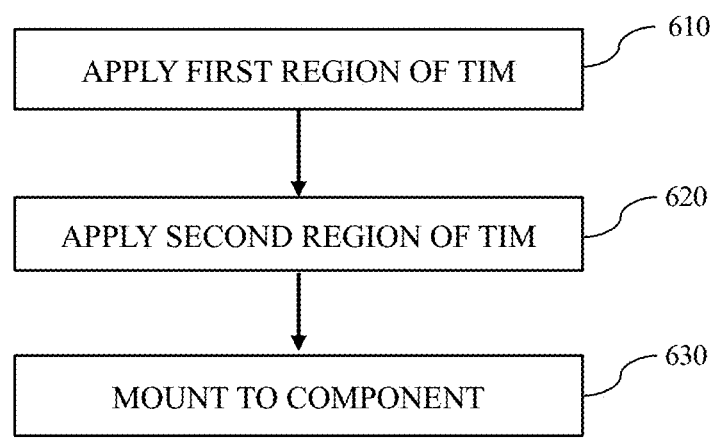
FIG. 6 schematically illustrates a process flow for applying one or more thermal interface materials to an intended heat-transfer region of a heat-transfer component, as depicted by the working embodiments in FIGS. 5A and 5B.

In some respects, disclosed principles pertain to heat-transfer components having a layer of TIM applied to a heat-transfer surface before assembly of the heat-transfer component with a heat-generating (or a heat-absorbing) device. For example, a composite TIM and an enclosing, second TIM, as described herein, can be applied to a heat-transfer component, a heat-generating component, or both, using conventional approaches. For example, as FIGS. 5A and 5B show, a composite TIM, a second TIM, or both, can be screen printed. In FIGS. 5A and 5B, 6 rows of 4 rectangular "pixels" of composite TIM 510 has been screen printed on the surface 505. In FIG. 5A, each rectangular "pixel" is laterally spaced from the others and from the surrounding second TIM 520. Further, each rectangular "pixel" is bisected by a diagonal gap, dividing each rectangular "pixel" into a pair of triangular "sub-pixels." Similarly, the second TIM 520 has been screen printed in a pixelated arrangement in FIGS. 5A and 5B. As shown, the pixelated arrangement of the second TIM 520, which surrounds the composite TIM 510, has a single rectangular "pixel" depth, though like the composite TIM 510, each rectangular "pixel" of the second TIM 520 is bisected by a diagonal gap, dividing each rectangular "pixel" into a pair of triangular "sub-pixels." In some embodiments, the composite TIM and the second TIM can be screen printed using a single screen-printing template. For example, a template can be placed over a surface that will receive the composite TIM and the second TIM. The composite TIM and the second TIM can then be applied consecutively or concurrently, e.g., using a roller or other screen-printing tool.

Alternatively, the composite TIM, the second TIM, or both, can be dispensed within the inner region 550 and outer region 560, respectively from a tube, syringe, or other dispensing device. In some embodiments (e.g., dispensed and screen-printed embodiments), the composite TIM and the second TIM can be applied to a surface with little or no gap between them.

Figure 7:
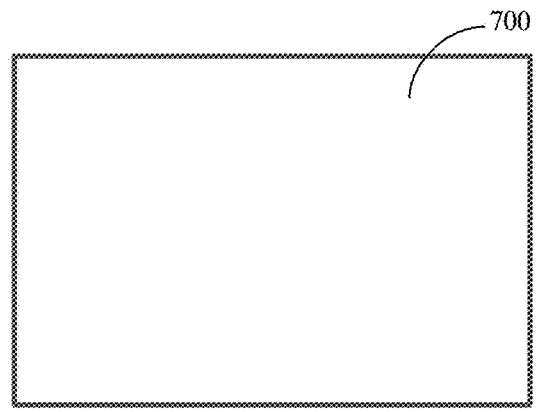
FIG. 7 schematically illustrates an intermediate construct arising from a process for applying one or more thermal-interface materials to an intended heat-transfer region of a heat-transfer component.
Figure 8A:
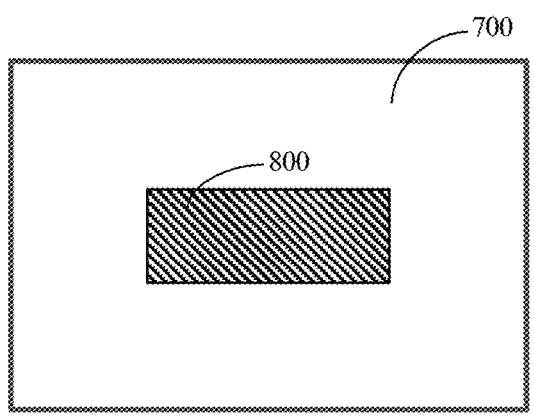
FIGS. 8A and 8B schematically illustrate possible embodiments of intermediate constructs arising from a process for applying one or more thermal-interface materials to an intended heat-transfer region of a heat-transfer component.
Figure 8B:
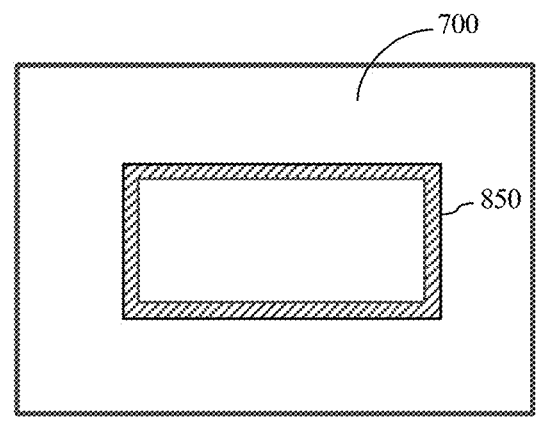
Figure 9:
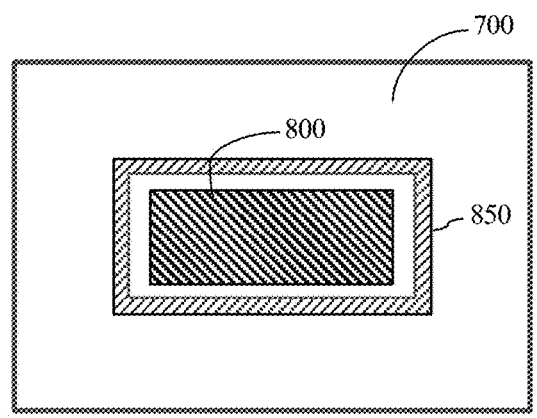
FIG. 9 schematically illustrates an embodiment of a heat-transfer component with one or more thermal-interface materials applied to an intended heat-transfer region of the heat-transfer component.

For example, referring now to FIGS. 6 through 9, methods of applying a composite TIM and a second, enclosing TIM are described. In FIG. 6, a first region of TIM is applied to a major surface of a heat-transfer component, a heat-generating component, or both, at 610. Such application can be effected by screen printing, dispensing (e.g., from a tube, syringe or other dispensing device) or otherwise applied. FIG. 7 shows an example of such a major surface 700. The TIM applied to the first region can be a composite TIM (as shown by the composite TIM 800 in FIG. 8A) or an enclosing second TIM (as shown by the second TIM 850 in FIG. 8B). Referring still to FIG. 6, a second region of TIM can be applied (e.g., via screen printing, dispensing, or another application technique) to the major surface at 620, resulting in a major surface as shown in FIG. 9. For example, when the composite TIM is applied at 610, as in FIG. 8A, the second thermal-interface material can be applied at 620, leading to the arrangement in FIG. 9. Alternatively, when the second TIM is applied at 610, as in FIG. 8B, the composite thermal-interface material can be applied at 620, also leading to the arrangement in FIG. 9. In further embodiments, the TIM applied at 610 can be applied to a major surface of a heat-generating component, and the TIM applied at 620 can be applied to a major surface of a heat-transfer component, or vice-versa. Further the TIM applied at 610 and the TIM applied at 620 can be applied to a major surface of a heat-generating component. At 630, the heat-transfer component can be mounted in a manner that places it into thermal contact with the heat-generating component with the composite TIM and the second TIM disposed within the interstitial region between the components. Compression of the components toward each other can cause the composite TIM and the second TIM to spread laterally outward and to wet the major surfaces of the heat-transfer component and the heat-generating component, providing a low-thermal-resistance interface between these components.

In connection with a multi-chip package, not shown, a "lattice" of thermal-interface materials can be applied to a heat-transfer component. For example, a plurality of composite and second TIM arrangements, each being similar to the arrangement shown in FIG. 4, can be applied to a major surface of a heat-transfer component to be placed into thermal contact with each of several heat-generating components. The position, orientation and size of each composite and second TIM arrangement can correspond to a respective heat-generating component among a plurality of heat-generating components, providing enhanced heat transfer from each heat-generating component.

In other embodiments, e.g., single-chip packages where the die defines one or more "hot-spots" or multi-chip packages where one or more of the plurality of dice defines one or more "hot-spots," an application of composite TIM can correspond to each "hot-spot" location and shape, and each application of composite TIM can be circumscribed by a second TIM as described above in relation to FIG. 4. Such alternative arrangements of composite TIM and second TIM are also amenable to screen printing or dispensing methods as described above.

The embodiments described above generally concern composite thermal-interface materials, a component of which are liquid or can partially or wholly undergo phase transition within an expected range of operating temperatures. More particularly, but not exclusively, this disclosure pertains to devices and systems for transferring heat, e.g., for cooling heat-generating, electrical components, that incorporate such composite thermal-interface materials.

Despite the description of certain details of composite thermal-interface materials, as well as heat-transfer components and heat-generating components, as well as electrical devices that incorporate them, the previous description is provided to enable a person skilled in the art to make or use the disclosed principles. Embodiments other than those described above in detail are contemplated based on the principles disclosed herein, together with any attendant changes in configurations of the respective apparatus or changes in order of method acts described herein, without departing from the spirit or scope of this disclosure. Various modifications to the examples described herein will be readily apparent to those skilled in the art.

Figure 1A:
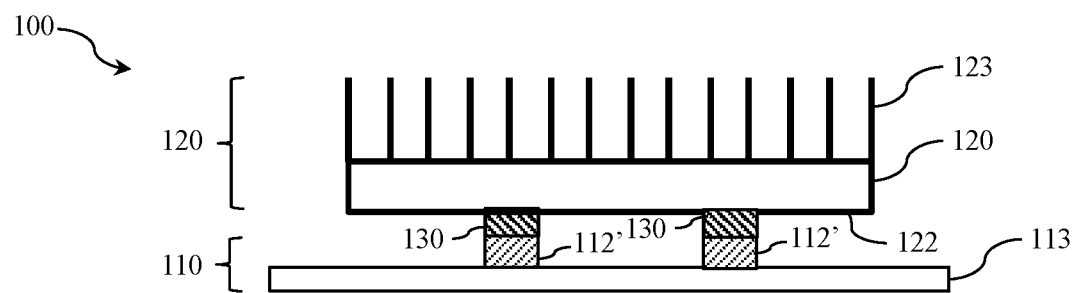
FIG. 1A shows a single package of an electrical device can habe one or more heat-generating components rather than the single heat-generating component shown in FIG. 1.

For example, heat-generating components may be embodied other than as shown in FIG. 1. For example (e.g., FIG. 1A), a single package of an electrical device can have one or more "chiplets" 112' rather than the single die 112 shown in FIG. 1. In such an embodiment, one or more of the chiplets 112' may be packaged under an integrated heat spreader (IHS) (not shown) and the IHS can be placed into thermal contact with a corresponding heat-transfer component. Still further, one or more of the chiplets 112' may have a bare die placed into thermal contact with a heat-transfer component. In some embodiments, each heat-generating die or other component is placed under an IHS, which is placed into thermal contact with the heat-transfer component. In some embodiments, each heat-generating component has a bare die, which is placed into thermal contact with the heat-transfer component. In still other system embodiments, one or more of the heat-generating die or other components is placed under an IHS, which is placed into thermal contact with the heat-transfer component, and one or more other of the heat-generating components has a bare die, which is also or alternatively placed into thermal contact with the heat-transfer component.

Further alternative embodiments are possible. For example, the description above provides details of a thermal-interface material applied to a heat-transfer component prior to assembly of the heat-transfer component with a heat-generating component. In other embodiments, the thermal-interface material can be applied to an outer surface (e.g., un-numbered major surface in FIG. 1) of a bare die or an outer surface of an IHS (e.g., rather than to the base 122 of the heat-transfer component 120) prior to assembly of the heat-transfer component with the heat-generating component.

Further, other system configurations and types incorporating composite thermal-interface materials of the type described herein can be cooled or heated. For example, one or more electrical components in a 1U (or even a ½-U) server (or other electronic device, such as, for example, a 5G cellular radio, a power generation or transmission device) can be cooled by a heat-transfer device and a disclosed thermal-interface material can be applied within an interstitial gap between the heat-transfer device and the electrical component. Many other types of electrical devices, such as, for example, a graphics processor, a television, power electronics devices (e.g., an IGBT), communications transmission devices and other networking devices, among others, have heat-dissipating devices that can incorporate metallic thermal-interface materials as described. As but one particular example, one or more heat-dissipating components in a communications or other network device (e.g., a so-called 5G transmission device) can be cooled by a heat-transfer device incorporating a pre-applied composite TIM. Similarly, some electrical storage batteries dissipate substantial amounts of heat while discharging or charging. For example, some batteries that can store substantial amounts of energy, e.g., a 5 kW-h to 50 kW-h or a 500 kW-h battery, can be cooled by a system that incorporates a composite thermal-interface material as described.

Directions and other relative references (e.g., up, down, top, bottom, left, right, rearward, forward, etc.) may be used to facilitate discussion of the drawings and principles herein, but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface, and the object remains the same. As used herein, "and/or" means "and" or "or", as well as "and" and "or." Moreover, all patent and non-patent literature cited herein is hereby incorporated by reference in its entirety for all purposes.

And, those of ordinary skill in the art will appreciate that the exemplary embodiments disclosed herein can be adapted to various configurations and/or uses without departing from the disclosed principles. Applying the principles disclosed herein, it is possible to provide a wide variety of metallic thermal-interface materials and heat-transfer components incorporating such metallic thermal-interface materials, as well as related methods and systems. For example, the principles described above in connection with any particular example can be combined with the principles described in connection with another example described herein. Thus, all structural and functional equivalents to the features and method acts of the various embodiments described throughout the disclosure that are known or later come to be known to those of ordinary skill in the art are intended to be encompassed by the principles described and the features and acts claimed herein. Accordingly, neither the claims nor this detailed description shall be construed in a limiting sense, and following a review of this disclosure, those of ordinary skill in the art will appreciate the wide variety of components, devices, systems, and related methods that can be devised using the various concepts described herein.

Moreover, nothing disclosed herein is intended to be dedicated to the public regardless of whether such disclosure is explicitly recited in the claims. No claim feature is to be construed under the provisions of 35 USC 112(f), unless the feature is expressly recited using the phrase "means for" or "step for".

The appended claims are not intended to be limited to the embodiments shown herein, but are to be accorded the full scope consistent with the language of the claims, wherein reference to a feature in the singular, such as by use of the article "a" or "an" is not intended to mean "one and only one" unless specifically so stated, but rather "one or more". Further, in view of the many possible embodiments to which the disclosed principles can be applied, we reserve the right to claim any and all combinations of features and technologies described herein as understood by a person of ordinary skill in the art, including the right to claim, for example, all that comes within the scope and spirit of the foregoing description, as well as the combinations recited, literally and equivalently, in any claims presented anytime throughout prosecution of this application or any application claiming benefit of or priority from this application, and more particularly but not exclusively in the claims appended hereto.

I currently claim:

1. A heat-transfer component, comprising:
a thermal-interface surface comprising a first region having an outer periphery and a second region surrounding the outer periphery of the first region;
a volume of composite thermal-interface material contained within the outer periphery of the first region, the composite thermal-interface material comprising a silicone oil substrate and a metallic filler, the metallic filler having a solid-to-liquid transition temperature between about 10° C. and about 95° C.; and
a volume of second thermal-interface material within the second region, wherein a composition of the composite thermal-interface material differs from a composition of the second thermal-interface material, wherein the second thermal-interface material is positioned outward of the composite thermal-interface material, defining a gap between the composite thermal-interface material and the second thermal-interface material.

2. The heat-transfer component according to claim 1, wherein the composite thermal-interface material comprises gallium, or an alloy thereof, wherein the second thermal-interface material is non-reactive with gallium, or the alloy thereof.

3. The heat-transfer component according to claim 2, wherein the second thermal-interface material comprises a silicone oil carrier substrate filled with a powdered metal, a powdered ceramic, or both, or the second thermal-interface material comprises a curable thermal-interface material.

4. The heat-transfer component according to claim 1, wherein a volume resistivity of the composite thermal-interface material exceeds about 50 Ohm-cm.

5. The heat-transfer component according to claim 1, wherein a ratio of volume resistivity of the second thermal-interface material to a volume resistivity of the composite thermal-interface material exceeds about $10^4$.

6. A heat-transfer component comprising:
  a thermal-interface surface comprising a first region having an outer periphery and a second region surrounding the outer periphery of the first region;
  a volume of composite thermal-interface material contained within the outer periphery of the first region, the composite thermal-interface material comprising a silicone oil substrate and a metallic filler, the metallic filler having a solid-to-liquid transition temperature between about 10° C. and about 95° C., wherein the metallic filler material comprises gallium; and
  a volume of second thermal-interface material within the second region, wherein a composition of the composite thermal-interface material differs from a composition of the second thermal-interface material, wherein the volume of composite thermal-interface material comprises a first volume of composite thermal-interface material, the heat-transfer component comprises a second volume of composite thermal-interface material, and the thermal-interface surface defines a further region bounded by the volume of second thermal-interface material and filled with the second volume of composite thermal-interface material.

7. The heat-transfer component according to claim 6, wherein the composite thermal-interface material has been screen printed to define a pixelated array on the thermal-interface surface.

8. The heat-transfer component according to claim 6, wherein a ratio of volume resistivity of the second thermal-interface material to a volume resistivity of the composite thermal-interface material exceeds about $10^4$.

9. The heat-transfer component according to claim 6, wherein the second thermal-interface material is non-reactive with gallium.

10. The heat-transfer component according to claim 9, wherein the second thermal-interface material comprises a silicone oil carrier substrate filled with a powdered metal, a powdered ceramic, or both, or the second thermal-interface material comprises a curable thermal-interface material.

11. The heat-transfer component according to claim 6, wherein a volume resistivity of the composite thermal-interface material exceeds about 50 Ohm-cm.

12. An electrical device comprising:
  a heat-generating component defining a first thermal-interface surface;
  a heat-transfer component defining a second thermal-interface surface, wherein the first thermal-interface surface and the second thermal-interface surface are positioned opposite to each other, defining a thermal interface between the heat-generating component and the heat-transfer component, wherein the thermal interface between the heat-generating component and the heat-transfer component comprises a first region having an outer periphery and a second region surrounding the outer periphery of the first region;
  a composite thermal-interface material within the thermal interface between the heat-generating component and the heat-transfer component, the composite thermal-interface material comprising a silicone oil substrate and a metallic filler, the metallic filler having a solid-to-liquid transition temperature between about 10° C. and about 95° C., wherein the composite thermal-interface material is positioned within the outer periphery of the first region; and
  a second thermal-interface material within the second region, wherein a composition of the composite thermal-interface material differs from a composition of the second thermal-interface material, the thermal interface between the heat-generating component and the heat-transfer component comprises a third region having an outer periphery, wherein the second region encloses the third region, wherein the composite thermal-interface material positioned within the outer periphery of the first region is a first volume of composite thermal-interface material, wherein the electrical device further comprises a second volume of composite thermal-interface material within the third region of the thermal interface.

13. The electrical device according to claim 12, wherein the metallic filler material comprises gallium.

14. The electrical device according to claim 13, wherein the second thermal-interface material is non-reactive with gallium.

15. The electrical device according to claim 13, wherein a ratio of volume resistivity of the second thermal-interface material to a volume resistivity of the composite thermal-interface material exceeds about $10^4$.

16. The electrical device according to claim 12, wherein a volume resistivity of the composite thermal-interface material exceeds about 50 Ohm-cm.

17. The electrical device according to claim 12, wherein the heat-transfer component is a heat-removal device configured to dissipate heat received from the heat-generating component, the heat-removal device having a base, the base having a first major surface and a second major surface opposite the first major surface, wherein the first major surface of the base defines the second thermal-interface surface, the heat-removal device further comprising a plurality of fins extending from the second major surface of the base.

18. The electrical device according to claim 12, wherein the heat-generating component comprises an electronic processing unit.

19. The electrical device according to claim 12, wherein the heat-generating component comprises a power electronics device.

20. The electrical device according to claim 12, wherein the heat-generating component is a first heat-generating component, wherein the electrical device comprises a second heat-generating component, the first heat-transfer component being further thermally coupled with the second heat-generating component.

21. A heat-transfer component comprising:
   a thermal-interface surface comprising a first region having an outer periphery and a second region surrounding the outer periphery of the first region;
   a volume of composite thermal-interface material contained within the outer periphery of the first region, the composite thermal-interface material comprising a silicone oil substrate and a metallic filler comprising gallium, the metallic filler having a solid-to-liquid transition temperature between about 10° C. and about 95° C., wherein the composite thermal-interface material has been screen printed to define a pixelated array on the thermal-interface surface; and
   a volume of second thermal-interface material within the second region, wherein a composition of the composite thermal-interface material differs from a composition of the second thermal-interface material, wherein the second thermal-interface material is positioned outward of the composite thermal-interface material, defining a gap between the composite thermal-interface material and the second thermal-interface material.

22. The heat-transfer component according to claim 21, wherein a volume resistivity of the composite thermal-interface material exceeds about 50 Ohm-cm.

23. The heat-transfer component according to claim 21, wherein a ratio of volume resistivity of the second thermal-interface material to a volume resistivity of the composite thermal-interface material exceeds about $10^4$.

24. The heat-transfer component according to claim 21, wherein the second thermal-interface material is non-reactive with gallium.

25. The heat-transfer component according to claim 24, wherein the second thermal-interface material comprises a silicone oil carrier substrate filled with a powdered metal, a powdered ceramic, or both, or the second thermal-interface material comprises a curable thermal-interface material.

26. An electrical device, comprising:
   a heat-generating component defining a first thermal-interface surface;
   a heat-transfer component defining a second thermal-interface surface, wherein the first thermal-interface surface and the second thermal-interface surface are positioned opposite to each other, defining a thermal interface between the heat-generating component and the heat-transfer component, wherein the thermal interface between the heat-generating component and the heat-transfer component comprises a first region having an outer periphery and a second region surrounding the outer periphery of the first region;
   a composite thermal-interface material within the thermal interface between the heat-generating component and the heat-transfer component, the composite thermal-interface material comprising a silicone oil substrate and a metallic filler comprising gallium, the metallic filler having a solid-to-liquid transition temperature between about 10° C. and about 95° C., wherein the composite thermal-interface material is positioned within the outer periphery of the first region; and
   a second thermal-interface material within the second region, wherein a composition of the composite thermal-interface material differs from a composition of the second thermal-interface material and a ratio of volume resistivity of the second thermal-interface material to a volume resistivity of the composite thermal-interface material exceeds about $10^4$.

27. The electrical device according to claim 26, wherein a volume resistivity of the composite thermal-interface material exceeds about 50 Ohm-cm.

28. The electrical device according to claim 26, wherein the heat-transfer component is a heat-removal device configured to dissipate heat received from the heat-generating component, the heat-removal device having a base, the base having a first major surface and a second major surface opposite the first major surface, wherein the first major surface of the base defines the second thermal-interface surface, the heat-removal device further comprising a plurality of fins extending from the second major surface of the base.

29. The electrical device according to claim 26, wherein the heat-generating component comprises an electronic processing unit.

30. The electrical device according to claim 26, wherein the heat-generating component comprises a power electronics device.

31. The electrical device according to claim 26, wherein the heat-generating component is a first heat-generating component, wherein the electrical device comprises a second heat-generating component, the first heat-transfer component being further thermally coupled with the second heat-generating component.

32. The electrical device according to claim 26, wherein the second thermal-interface material is non-reactive with gallium.

* * * * *